US012622306B2

(12) United States Patent
Chen et al.

(10) Patent No.: US 12,622,306 B2
(45) Date of Patent: May 5, 2026

(54) SEMICONDUCTOR DEVICE WITH OPTIMIZED UNDERFILL FLOW

(71) Applicant: SANDISK TECHNOLOGIES, INC., Milpitas, CA (US)

(72) Inventors: Yihao Chen, Shanghai (CN); Tim Huang, Shanghai (CN); Zengyu Zhou, Shanghai (CN); Rui Yuan, Shanghai (CN); Fen Yu, Shanghai (CN); Hope Chiu, Shanghai (CN)

(73) Assignee: SANDISK TECHNOLOGIES, INC., Milpitas, CA (US)

( * ) Notice: Subject to any disclaimer, the term of this patent is extended or adjusted under 35 U.S.C. 154(b) by 631 days.

(21) Appl. No.: 17/699,979

(22) Filed: Mar. 21, 2022

(65) Prior Publication Data

US 2023/0299034 A1 Sep. 21, 2023

(51) Int. Cl.
*H01L 23/00* (2006.01)
*H01L 23/498* (2006.01)

(52) U.S. Cl.
CPC ........ *H01L 24/29* (2013.01); *H01L 23/49838* (2013.01); *H01L 24/06* (2013.01); *H01L 24/16* (2013.01); *H01L 24/73* (2013.01); *H01L 2224/0401* (2013.01); *H01L 2224/16227* (2013.01); *H01L 2224/26175* (2013.01); *H01L 2224/73204* (2013.01)

(58) Field of Classification Search
CPC ... H01L 24/29; H01L 23/49838; H01L 24/06;

H01L 24/16; H01L 24/73; H01L 2224/0401; H01L 2224/16227; H01L 2224/26175; H01L 2224/73204; H01L 23/49816

See application file for complete search history.

(56) References Cited

U.S. PATENT DOCUMENTS

2012/0135565 A1* 5/2012 Yamato ............... H01L 23/3128
438/126
2017/0213804 A1* 7/2017 Lin ......................... H01L 24/17

* cited by examiner

*Primary Examiner* — Cuong B Nguyen
(74) *Attorney, Agent, or Firm* — Morgan, Lewis & Bockius LLP

(57) ABSTRACT

A semiconductor device package includes a semiconductor die including bond pads and an underfill inlet side, a substrate including a first metal layer and lower metal layers underneath the first metal layer, a plurality of metal contacts and trace segment lines disposed in the first metal layer, and a plurality of solder bump rows. Each of the solder bump rows is oriented substantially parallel to the inlet side of the semiconductor die and electrically connects bond pads of the semiconductor die with corresponding metal contacts in the first metal layer of the substrate. Each of the trace segment lines is oriented substantially parallel to the inlet side of the semiconductor die, is electrically coupled to a respective solder bump row of the plurality of solder bump rows, and includes trace segments disposed in the first metal layer and trace segments disposed in one or more of the lower metal layers.

14 Claims, 6 Drawing Sheets

Figure 1

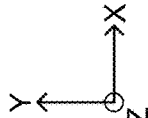
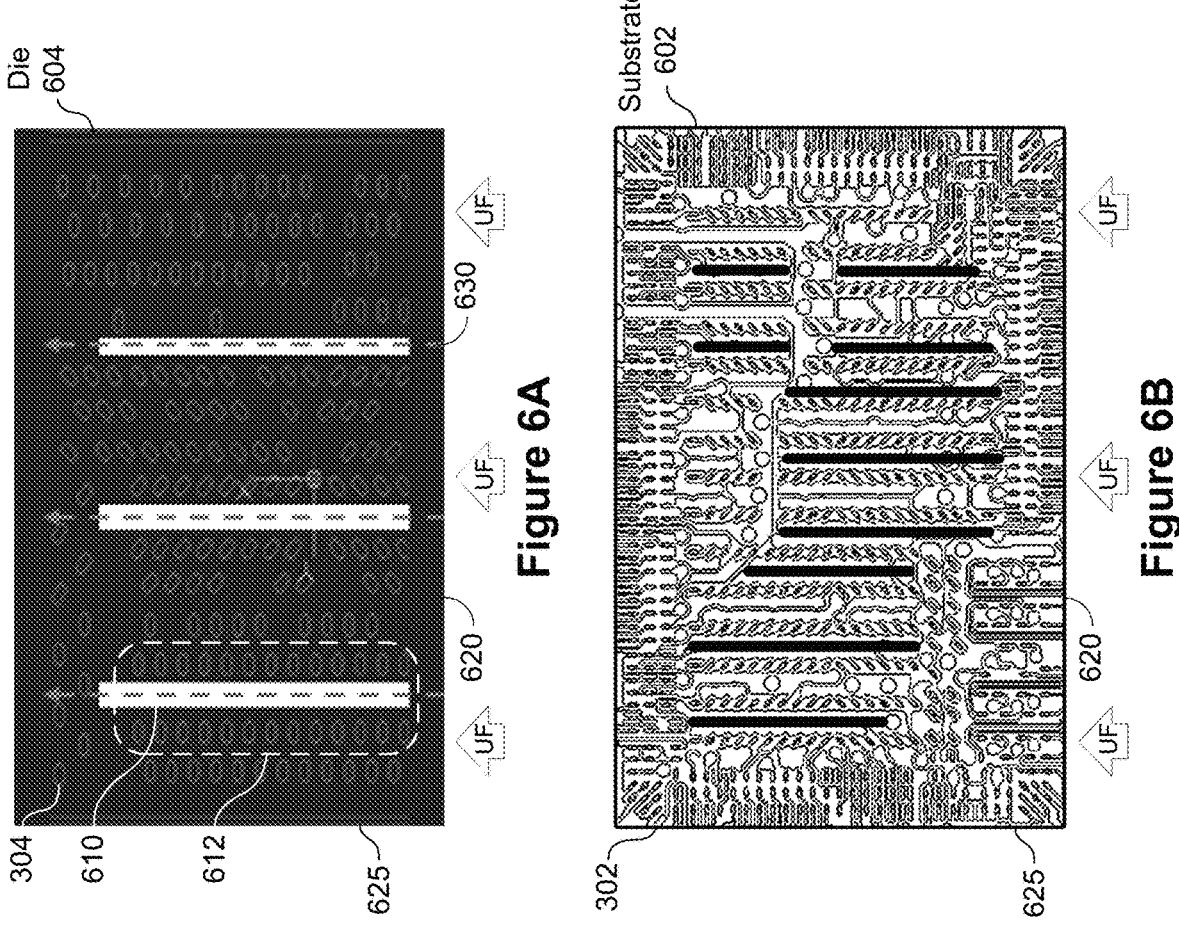
Figure 6A
Figure 6B

SEMICONDUCTOR DEVICE WITH OPTIMIZED UNDERFILL FLOW

BACKGROUND

A semiconductor device package may include one or more semiconductor dies packaged together on a substrate. A die may be coupled to the substrate using flip chip mounting, in which connections between the die and the substrate are formed using an array of solder joints. The solder joints may be positioned over and coupled to corresponding metal contacts and traces in the substrate. An underfill material may reduce thermal stresses on the solder joints and corresponding metal contacts.

As semiconductor memory packages continue to increase in storage capacity and complexity, the solder joint array increases in complexity, which causes the layout of the metal traces in the substrate to increase in complexity. The metal traces may become thicker, longer, and/or more numerous in order to accommodate the increased quantity of solder joints in the array. The layout of the resulting traces may obstruct the flow of underfill during the manufacturing process, leaving voids in areas that are expected to be covered in underfill, which may have the undesired effect of weakening the solder joints in these areas.

SUMMARY

The present disclosure describes a semiconductor device package having an improved trace layout in the top layer of the substrate, thereby improving underfill flow during the manufacturing process.

In one improved trace layout, gaps are introduced in longer traces oriented perpendicular to the direction of underfill flow by using vias to periodically route the traces through a lower layer in the substrate. In another improved trace layout, longer traces are reoriented to be parallel to the direction of underfill flow.

Thus, the improved trace layouts described herein decrease obstructions to the flow of underfill during the manufacturing process, thereby decreasing the occurrence of underfill voids, which has the desired effect of consistently strong solder joint arrays in the semiconductor die.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

FIG. 1 is a cross-sectional side view of a semiconductor device package including a semiconductor die coupled to a substrate using flip chip mounting.

FIGS. 6A-6B are views of a solder joint array and corresponding trace layout including long traces that are parallel to the direction of underfill flow in accordance with some implementations.

DETAILED DESCRIPTION

Figure 2:
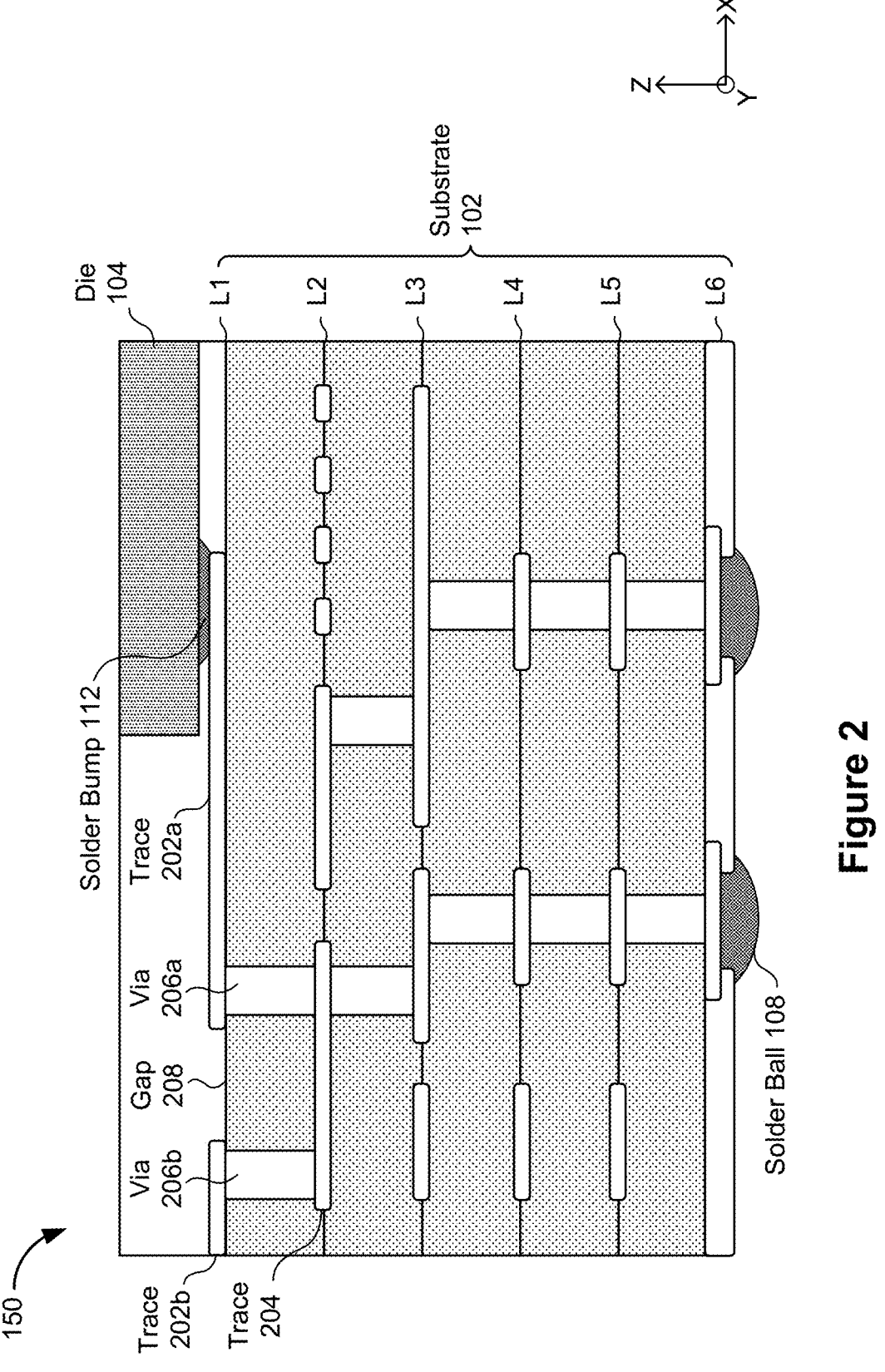
FIG. 2 is a detailed view of a portion of the semiconductor device package depicted in FIG. 1.

The present subject matter will now be described more fully hereinafter with reference to the accompanying Figures, in which representative embodiments are shown. The present subject matter can, however, be embodied in different forms and should not be construed as limited to the embodiments set forth herein. For example, although a semiconductor device for an SSD is discussed, it will be apparent to those of skill in the art that the concepts disclosed herein have much broader application than just SSDs. Thus, these embodiments are provided to describe and enable one of skill in the art. The elements illustrated in the accompanying FIGURES are not necessarily drawn to scale, but rather, may have been exaggerated to highlight the important features of the subject matter therein. Furthermore, the Figures may have been simplified by omitting elements that are not necessarily needed for the understanding of the disclosed embodiments.

Figure 1:
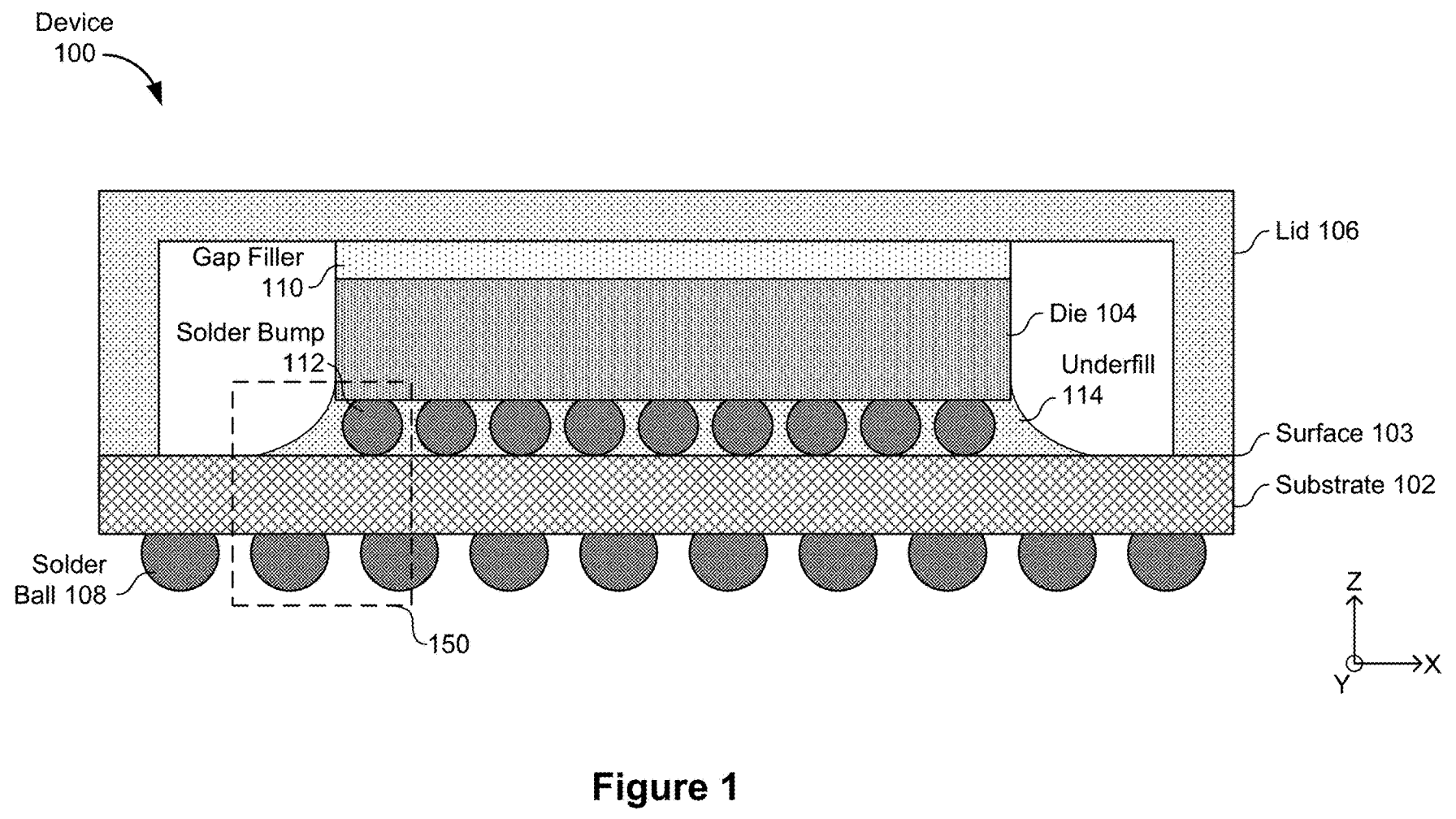

FIG. 1 is a diagram illustrating an example semiconductor device 100 (also referred to as a semiconductor package, semiconductor device package, or semiconductor memory package). Device 100 may be any type of semiconductor device, such as a system-in-package (SiP), a secure digital (SD) card, a MultiMediaCard (MMC), or a solid-state drive (SSD).

Device 100 includes a substrate 102 and at least one semiconductor die 104 mounted thereon. Substrate 102 may be a printed circuit board (PCB) having electronic circuitry on a top surface 103, a bottom surface, or both. Die 104 may be a non-volatile memory component, such as a flash memory chip (e.g., a NAND chip) for the storage of data. In the illustrated example, die 104 is positioned on top surface 103 of substrate 102. Additional dies 104 may be positioned at other locations on substrate 102 in other examples. For example, in some implementations, additional dies 104 may be positioned adjacent to one another on top surface 103 and/or on a bottom surface of substrate 102. In some implementations, one die 104 may be a controller (e.g., a flash memory controller, controller die), which may be configured to manage data stored in other dies 104 (e.g., memory chips) and to communicate with a computer or other electronic device to which device 100 may be connected during operation.

Disposed on or around substrate 102 and die 104 is a lid 106 (also referred to as an enclosure), which covers and protects the other components of device 100. Lid 106 may be made from, for example, a plastic material or more preferably metal. Lid 106 may include multiple portions or pieces, including a top cover, bottom cover (not included in this example), and structural adhesive. In some implementations, (e.g., if device 100 is an SSD), lid 106 may surround the top and bottom of substrate 102, forming an enclosure. A gap filler 110 (e.g., a thermal interface material) may be placed between die 104 and lid 106, thereby conducting heat away from the die and dispersing the heat through the lid, which provides thermal protection to device 100.

Substrate 102 is both a mechanical base support of device 100 and an electrical interface that provides access to the die(s) 104 housed within device 100. As an electrical interface, substrate 102 includes a plurality of metal layers, including at least one layer for routing data using conductive (e.g., copper) traces, a ground layer, and/or a power layer. The plurality of metal layers include at least a top layer in electrical contact with die 104 and solder bumps 112 upon which die 104 and other elements may be mounted, and a bottom layer in electrical contact with solder balls 108, through which signals are routed between die 104 and circuit elements outside device 100.

Die 104 may be mounted to substrate 102 using flip chip mounting, in which the die 104 is electrically connected to the circuitry of substrate 102 via a solder joint array comprising a plurality of solder bumps 112. In this configuration, die 104 may be referred to as a flip chip. The solder bumps 112 interconnect die 104 to other circuitry within device 100 (e.g., a controller and/or other dies). Solder bumps 112 may be deposited on bond pads on the top side of die 104 during the final die processing step. In order to mount die 104 to substrate 102, the die is flipped over so that its top side faces down, and aligned so that its bond pads align with matching pads on the substrate 102, and then the solder bumps 112 are reheated (e.g., using a thermosonic bonding or reflow solder process) to produce electrical connection at each solder bump.

A small space is typically left between the die 104 and substrate 102. An electrically-insulating adhesive such as capillary underfill (CUF) 114, is typically disposed in this space to provide a stronger mechanical connection, provide a heat bridge, and to ensure the solder bumps are not stressed due to differential heating of the die 104 and the rest of the device 100. The underfill 114 distributes thermal expansion mismatch between the substrate 102 and the die 104, preventing stress concentration in the solder bumps 112 which would lead to premature failure.

FIG. 2 is a detailed view of a portion 150 of the semiconductor device package 100 depicted in FIG. 1. Substrate 102 includes a plurality of metal layers L1 through L6. The metal layers may alternatively be referred to as metal layers M1 through M6. In other examples, there may be fewer than six layers or more than six layers. Between each metal layer is a dielectric region which provides insulation. The metal (e.g., copper) in each layer is shaped to provide routes (traces) through which electricity flows and/or to provide ground or power planes. For example, traces 202a and 202b provide pathways for electricity in the top layer L1, while trace 204 provides a pathway for electricity in the second layer L2.

Traces in each layer may be electrically coupled using vias, which are conductive conduits extending between two metal layers. For example, via 206a electrically couples trace 202a (which is in electric contact with solder bump 112) with trace 204, while via 206b electrically couples trace 204 with trace 202b. Thus, a conductive circuit is formed between solder bump 112 and trace 202b, even though there is a gap 208 in the top metal layer L1 between solder bump 112 and trace 202b. The exact layout of traces and vias with respect to the various layers in the substrate depend on the electronic circuits that are implemented in the substrate, and the layout shown in FIG. 2 is for illustrative purposes.

Figure 3:
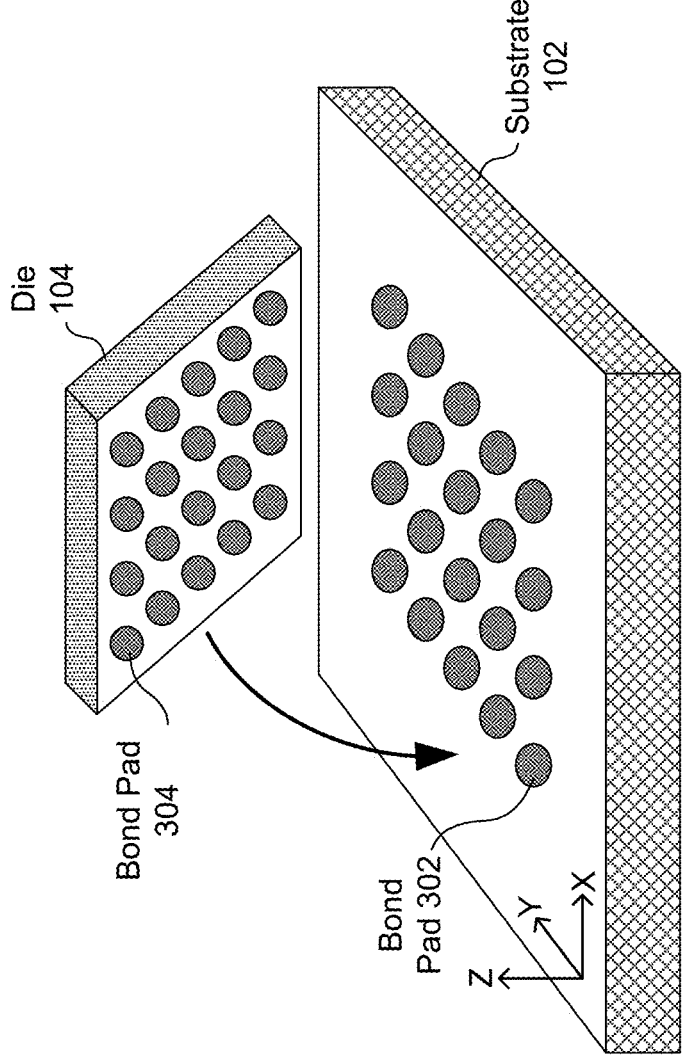
FIG. 3 is a perspective view of a solder joint array and corresponding bond pads in a semiconductor device package.

FIG. 3 is a perspective view of an array of die bond pads 304 and corresponding substrate bond pads 302 in a semiconductor device package. The bond pads 302/304 may alternatively be referred to as metal contacts 304/302. For example, bond pads 304 may be described as being in electrical contact with metal contacts 302 using an array of solder bumps 112 (FIG. 1). Solder bumps 112 (FIG. 1) are deposited on die bond pads 304, the die 104 is flipped over so that the side with the solder bumps 112 faces the top surface of substrate 102, and aligned so that the die bond pads 304 align with matching substrate bond pads 302, and then the solder bumps are reheated (e.g., using a thermosonic bonding or reflow solder process) to produce electrical connection at each solder bump.

Figures 4A, 4B:
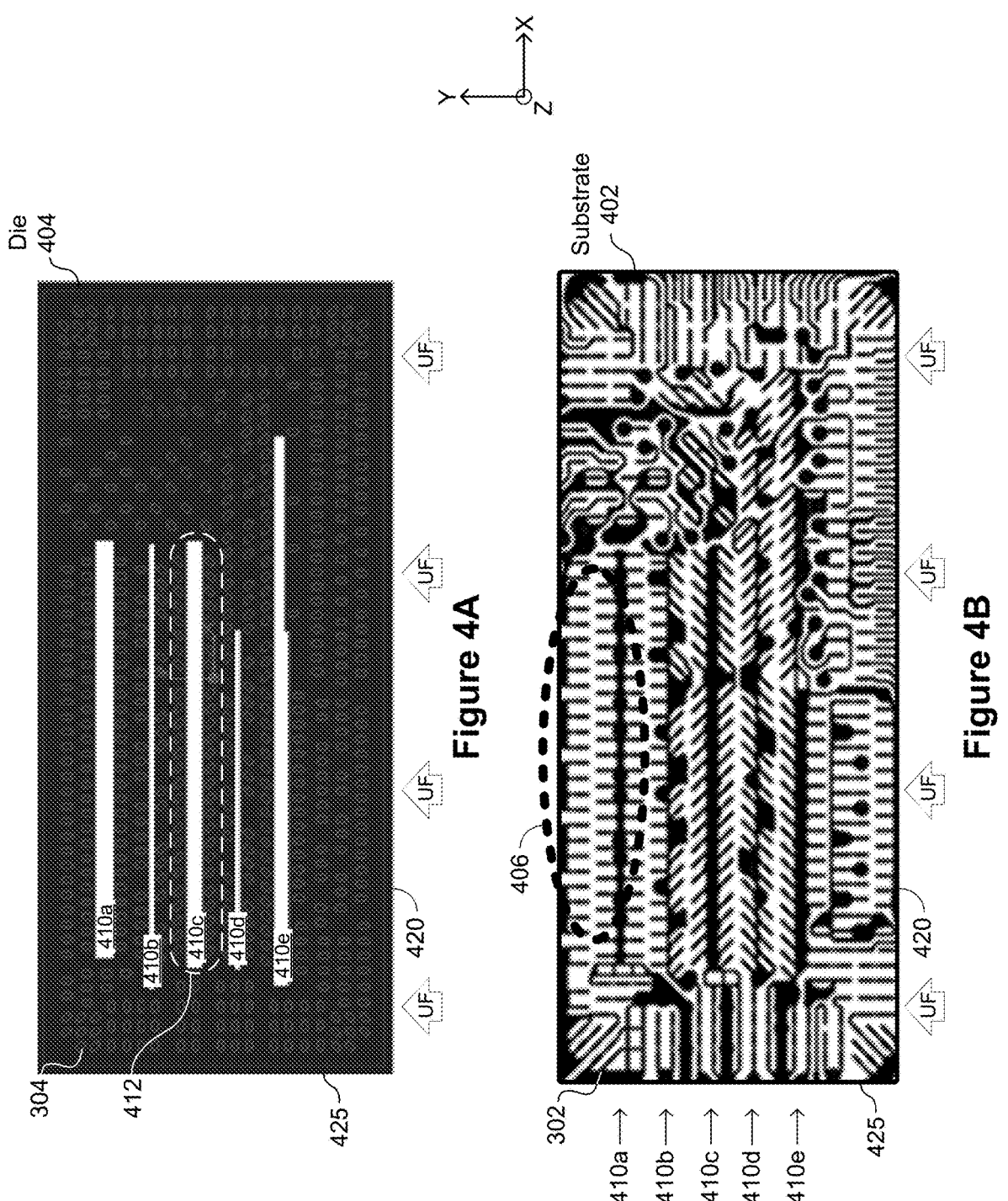
FIGS. 4A-4B are views of a solder joint array and corresponding trace layout including long traces that are perpendicular to the direction of underfill flow.

FIGS. 4A-4B are views of a solder joint array (including a plurality of bond pads 304) of a semiconductor die 404 and corresponding trace layout (including a plurality of bond pads 302) of a substrate 402, including long traces 410a-e that are perpendicular to the direction of underfill flow. Aside from differences in solder joint and metal trace layouts, die 404 corresponds to die 104 (FIGS. 1-3), and substrate 402 corresponds to substrate 102 (FIGS. 1-3).

Die 404 is rectangular and has two sides (including long side 420) having a first length, and two sides (including short side 425) having a second length shorter than the first length. As part of the capillary underfill process, underfill (see 114, FIG. 1) is dispensed along the long side 420 of the die 404 (in the direction of the UF arrows, the positive Y direction). Side 420 may be referred to as an inlet side or a dispensing side, since the underfill is dispensed from an inlet adjacent to this side. During manufacturing, the underfill is dispensed from one side only (the inlet/dispensing side). The underfill flows across the area of the substrate 402 underneath the die 404 until the entire area underneath the die is covered (or assumed to be covered) with underfill.

The longer the area required for the underfill to cover, the greater the chance of a gap in the underfill, referred to as an underfill void. Thus, underfill is typically dispensed along the long side 420 of the die, from which the underfill flows in the positive Y direction, traveling the width of the die. This decreases the chance of underfill voids, since the width of the die (in the Y direction) is smaller than the length of the die (in the X direction). However, in certain instances (described below), routing of metal traces on the top layer of the substrate 402 may interfere with the flow of underfill in this direction.

Each (or a substantial portion) of the bond pads 302 on the top surface of substrate 402 requires a connection to a metal layer of the substrate 402 in order to route power and signals between the substrate 402 and the bond pads 304 of the die 404. The simplest way to connect bond pads 302 to the various metal layers of the substrate is to connect many of them in a daisy-chain manner using long metal traces oriented parallel to the direction of the length of the die (in the X direction). Stated another way, since many of the bond pads 304/302 are laid out in an adjacent manner in the X direction, the least complicated routing system involves laying out traces in the X direction. Examples of such traces are depicted as traces 410a-e in substrate 402 (FIG. 4B), with corresponding areas depicted in die 404 (FIG. 4A).

Thus, in order to accommodate bond pads 302/304, large metal traces in substrate 402 are usually designed to be parallel to the long side of the die. As used herein, "large trace" refers to a trace that is parallel to the long side 420 of the die and has a length greater than or equal to a threshold that risks obstructing underfill from filling the entire region underneath the die. Example thresholds are 25%, 33%, or 50% of the length of the long side 420 of the die. The difference in threshold lengths may depend on the placement of the trace with respect to the center of the die and the length and position of neighboring large traces. For example, a large trace that is closer to the middle of the die and is close to other large traces has much more potential to obstruct the flow of underfill than a large trace that does not obstruct (or obstructs less of) the area under the middle of the die and has fewer neighboring large traces. These large traces cause a risk of underfill voids because the traces can obstruct underfill flow by changing the direction of the underfill and preventing the underfill from reaching certain regions of the substrate underneath the die, such as region 406.

Referring to the example of FIG. 4B, large upper layer (L1) copper traces 410a-e in the substrate 402 are parallel to the die dispensing side (inlet side) 420 (parallel to the X direction) and perpendicular to the direction of the dispensing flow (perpendicular to the Y direction). A substrate having a trace layout as shown in FIG. 4B may be associated with a low performance dispensing flow due to the obstacles posed by the large/long traces 410a-e, which slow down underfill passing through, and have the potential to introduce a concave shape to the underfill flow front, resulting in underfill voids in regions far from the dispensing side (e.g., in region 406).

Figures 5A, 5B:
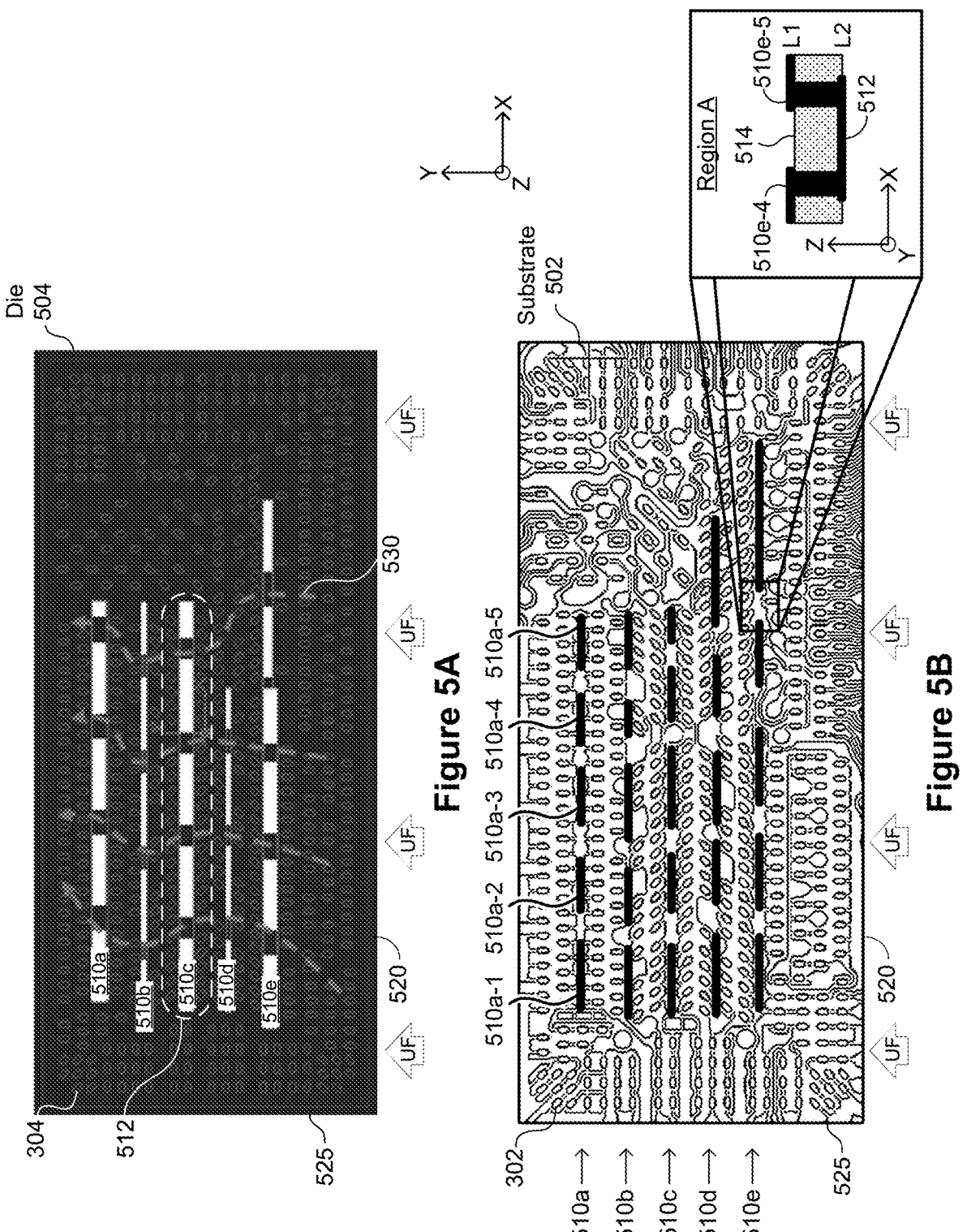
FIGS. 5A-5B are views of a solder joint array and corresponding trace layout including long traces that are perpendicular to the direction of underfill flow and include gaps for underfill flow in accordance with some implementations.

FIGS. 5A-5B are views of a solder joint array (including a plurality of bond pads 304) of a semiconductor die 504 and corresponding trace layout (including a plurality of bond pads/mental contacts 302) of a substrate 502, including long traces 510a-e that are perpendicular to the direction of underfill flow and include gaps for underfill flow in accordance with some implementations. Traces 510a-e are alternatively referred to as trace segment lines, since they comprise a plurality of trace segments arranged in a line, with each trace segment alternating between the first metal layer (e.g., L1, FIG. 2) and a lower metal layer (e.g., L2, FIG. 2) and electrically connected using vias. Aside from differences in solder joint and metal trace layouts, die 504 corresponds to die 104 (FIGS. 1-3), and substrate 502 corresponds to substrate 102 (FIGS. 1-3).

Die 504 is rectangular and has two sides (including long side 520) having a first length, and two sides (including short side 525) having a second length shorter than the first length. As part of the capillary underfill process, underfill (see 114, FIG. 1) is dispensed along the long side 520 of the die 504 (in the direction of the UF arrows, the positive Y direction). Side 520 may be referred to as an inlet side or a dispensing side, since the underfill is dispensed from an inlet adjacent to this side. During manufacturing, the underfill is dispensed from one side only (the inlet/dispensing side). The underfill flows across the area of the substrate 502 underneath the die 504 until the entire area underneath the die is covered with underfill.

Like the bond pad layout in FIGS. 4A-4B, the bond pads 304/302 in FIGS. 5A-5B are arrange such that the most efficient trace layout involves large traces in the top layer of the substrate 502 that can potentially obstruct the flow of underfill. However, unlike the large traces 410a-e in FIGS. 4A-4B, the large traces 510a-e in FIGS. 5A-5B are periodically interrupted on the top layer. Stated another way, each trace that is long enough to have potentially obstructed underfill flow (e.g., 501a) is split into a plurality of trace segments (e.g., 510a-1 through 510a-5) on the top layer, with each trace segment in the top layer being connected using vias and trace segments in a lower layer, forming a gap at the top layer where the trace is disconnected.

For example, at Region A of substrate 502, trace 510e is disconnected at the top layer, forming segments 510e-4 and 510e-5 at the top layer and providing a gap 514 between them. Each trace segment, however, is still electrically connected by two vias and a trace segment 512 at a lower layer. Additional discussion regarding trace disconnections and re-routing to segments in lower layers using vias is provided above with reference to FIG. 2 (traces 202a-b and 204, vias 206a-b, and gap 208).

As a result of the gaps formed in traces 510a-e, underfill can more easily flow through the entire width of the area of substrate 502 underneath die 504 (in the +Y direction), thereby resulting in better anti-void performance (due to fewer to no voids in the underfill).

In some implementations, the gaps are at least the length of two adjacent bond pads 304. For examples in which there are 30-50 micrometers (um) between each bond pad, then the gaps are at least 60-100 um long. In other examples, there may be less than 30 um or greater than 50 um between each bond pad. In such examples, the gaps may still be between 60-100 um long, regardless of the distance between each bond pad. In general, the length of a particular gap may be based on the physical properties of the underfill (e.g., how easily the underfill can flow through a given gap) and/or the position of the gap with respect to its distance from the inlet side 520 (e.g., the smaller the distance, the larger the gap, and vice versa).

In some implementations, the gaps in neighboring traces 510 may be positioned so that they substantially line up, forming channels in the Y direction (depicted by dotted lines in FIG. 5A). For example, gaps in adjacent traces may be substantially lined up if there is at least some overlap in the gaps (e.g., if there is at least some overlap in the X direction between gaps in traces separated by a distance in the Y direction). The positioning of the gaps, including the amount of overlap, may be based on routing constraints (e.g., whether there are trace segments in lower layers that cannot be moved to make room for the re-routing of a long trace) and/or position of the gaps with respect to their distance from the inlet side 520 (e.g., the smaller the distance, the greater the overlap, and vice versa).

The following discussion includes implementations of an example embodiment with reference to FIGS. 5A-5B.

In some implementations, a semiconductor device package 100 comprises a semiconductor die 504, a substrate 502, and a solder joint array including solder bumps configured to electrically connect bond pads of the die (e.g., 304) to corresponding metal contacts of the substrate (e.g., 302).

In some implementations, the semiconductor die 504 includes a plurality of bond pads 304, and an inlet side 520 corresponding to a dispensing inlet for underfill flow.

In some implementations, the substrate 502 includes a first metal layer (L1, see FIG. 2) disposed at a top surface of the substrate; one or more lower metal layers (e.g., L2-L6, see FIG. 2) disposed underneath the first metal layer; a plurality of metal contacts 302 disposed in the first metal layer; and a plurality of trace segment lines 510 disposed in the first metal layer.

In some implementations, the solder joint array includes a plurality of solder bump rows, which correspond to rows of bond pads 304 in the die 504 (e.g., rows 512). Each of the plurality of solder bump rows is oriented substantially parallel (e.g., 0°+/−15°) to the inlet side of the semiconductor die; and electrically connects bond pads 304 of the semiconductor die with corresponding metal contacts 302 in the first metal layer of the substrate.

In some implementations, each of the plurality of trace segment lines 510*a-e* is oriented substantially parallel (e.g., 0°+/−15°) to the inlet side 520 of the semiconductor die; is electrically coupled to a respective solder bump row (e.g., see rows 512) of the plurality of solder bump rows; and includes: a first plurality of trace segments (e.g., 510*a*-1 through 510*a*-5, 510*e*-4, and 510*e*-5) disposed in the first metal layer, and a second plurality of trace segments (e.g., 512) disposed in the one or more lower metal layers.

In some implementations, the first metal layer further includes a plurality of underfill channels (e.g., 530) that are substantially perpendicular (e.g., 180°+/−15°) to the inlet side of the semiconductor die. The underfill channels are regions through which underfill (114, see FIG. 1) may flow during manufacturing, as described above. For example, the plurality of underfill channels include regions (514) corresponding to the second plurality of trace segments (512). Stated another way, the plurality of underfill channels include regions (514) between trace segments of the first plurality of trace segments (510*e*-4 and 510*e*-5).

In some implementations, for each of the plurality of trace segment lines 510*a-e*, each trace segment of the second plurality of trace segments (e.g., 512) has a length of at least a distance between two adjacent solder bumps (the solder bump pitch). Accordingly, each of the gaps between trace segments in the first metal layer has a length of at least the distance of the solder bump pitch.

In some implementations, for each of the plurality of trace segment lines 510*a-e*, regions of the first metal layer (514) between trace segments of the first plurality of trace segments (510*e*-4 and 510*e*-5) are free from metal. Stated another way, for each of the plurality of trace segment lines, regions of the first metal layer (514) corresponding to trace segments of the second plurality of trace segments (512) are free from metal.

In some implementations, the plurality of trace segment lines includes a first trace segment line (e.g., 510*e*) and a second trace segment line (e.g., 510*d*) adjacent to the first trace segment line, and segments of the first trace segment line that are free from metal (e.g., gap 514 in line 510*e*) in the first metal layer substantially overlap with segments of the second trace segment line that are free from metal (e.g., the gap above 514 in line 510*e*) in the first metal layer. In some implementations, two segments substantially overlap if the distance in the X direction between either end of one segment and either end of the other segment is no greater than the length of one of the two segments in the X direction. As such, two segments may substantially overlap even if they do not literally overlap. As such, the substantially overlapping segments that are free from metal form an underfill flow channel (e.g., 530) in the first metal layer.

In some implementations, the semiconductor die is rectangular, including two sides having a first length (e.g., side 520) and two sides having a second length (e.g., side 525) shorter than the first length. As such, the inlet side is the one of the two sides having the first length (side 525).

In some implementations, for each of the plurality of trace segment lines 510*a-e*, trace segments in the first plurality of trace segments (e.g., 510*e*-4 and 510*e*-5) are electrically connected to trace segments in the second plurality of trace segments (e.g., 512) with vias (e.g., 206*a-b*, see FIG. 2) disposed between the first metal layer and the one or more lower metal layers.

FIGS. 6A-6B are views of a solder joint array (including a plurality of bond pads 304) of a semiconductor die 604 and corresponding trace layout (including a plurality of bond pads 302) of a substrate 602, including long traces 610 that are parallel to the direction of underfill flow in accordance with some implementations. Aside from differences in solder joint and metal trace layouts, die 604 corresponds to die 104 (FIGS. 1-3), and substrate 602 corresponds to substrate 102 (FIGS. 1-3).

Die 604 is rectangular and has two sides (including long side 620) having a first length, and two sides (including short side 625) having a second length shorter than the first length. As part of the capillary underfill process, underfill (see 114, FIG. 1) is dispensed along the long side 620 of the die 604 (in the direction of the UF arrows, the positive Y direction). Side 620 may be referred to as an inlet side or a dispensing side, since the underfill is dispensed from an inlet adjacent to this side. During manufacturing, the underfill is dispensed from one side only (the inlet/dispensing side). The underfill flows across the area of the substrate 602 underneath the die 604 until the entire area underneath the die is covered with underfill.

Unlike the bond pad layout in FIGS. 4A-4B and FIGS. 5A-5B, the bond pads 304/302 in FIGS. 6A-6B are arranged in lines that are parallel to the short side 625 of the rectangular die, and thus parallel to the direction of underfill flow. As such, the most efficient trace layout involves large traces in the top layer of the substrate 602 that do not obstruct the flow of underfill. This is because the large traces (traces that are at least 33% as long as the short side 625 of the die, or at least 50% as long as the short side 625 of the die) are parallel to the direction of underfill flow, so as not to obstruct the underfill as it flows in the space underneath the die.

As a result of the layout of the long traces 610, underfill can more easily flow through the entire width of the area of substrate 602 underneath die 604 (in the +Y direction from inlet side 620), thereby resulting in better anti-void performance (due to fewer to no voids in the underfill).

The following discussion includes implementations of an example embodiment with reference to FIGS. 6A-6B.

In some implementations, a semiconductor device package 100 comprises a semiconductor die 604, a substrate 602, and a solder joint array including solder bumps configured to electrically connect bond pads of the die (e.g., 304) to corresponding metal contacts of the substrate (e.g., 302).

In some implementations, the semiconductor die 604 includes a plurality of bond pads 304, and an inlet side 620 corresponding to a dispensing inlet for underfill flow.

In some implementations, the substrate 602 includes a first metal layer (L1, see FIG. 2) disposed at a top surface of the substrate; a plurality of metal contacts 302 disposed in the first metal layer; and a plurality of traces 610 disposed in the first metal layer.

In some implementations, the solder joint array includes a plurality of solder bump rows, which correspond to rows of bond pads 304 in the die 604 (e.g., rows 612). Each of the plurality of solder bump rows is oriented substantially perpendicular (e.g., 180°+/−) 15° to the inlet side of the semiconductor die; and electrically connects bond pads 304 of the semiconductor die with corresponding metal contacts 302 in the first metal layer of the substrate.

In some implementations, each of the plurality of traces 610 is oriented substantially perpendicular (e.g., 180°+/−15°) to the inlet side 620 of the semiconductor die; and is electrically coupled to a respective solder bump row (e.g., see row 612) of the plurality of solder bump rows.

In some implementations, the first metal layer further includes a plurality of underfill channels 630 that are substantially perpendicular (e.g., 180°+/−15°) to the inlet side of the semiconductor die.

In some implementations, the plurality of underfill channels (e.g., 630) are respectively adjacent to and substantially parallel to the plurality of traces (e.g., 612). In some implementations, each of the plurality of traces is disposed in the first metal layer.

In some implementations, the semiconductor die has a width side 625 that is shorter than and substantially perpendicular (e.g., 180°+/−15°) to the inlet side 630; and each of the plurality of traces 612 has a length of at least 40% of the width side. Alternatively, each trace 612 may have a length that meets a threshold percentage of the width side, wherein the threshold may be lower than 40% (e.g., 10%, 33%, etc.) or greater than 40% (e.g., 50%, 66%, etc.).

In some implementations, the semiconductor die is rectangular, including two sides (e.g., side 620) having a first length and two sides (e.g., side 625) having a second length shorter than the first length; and the inlet side is one of the two sides having the first length (side 620).

Thus, the implementations described herein with reference to FIGS. 5A-5B and 6A-6B minimize the obstacle effects of metal traces in the top layer of the substrate. This allows the underfill to flow as desired and decreases (or even eliminates) underfill void issues. As a result, the underfill can flow more effectively and result in better anti-void performance, which enlarges the process margin due to the better quality and reliability performance obtained.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

The invention claimed is:

1. A semiconductor device package comprising:
   a semiconductor die including:
      a plurality of bond pads; and
      an inlet side corresponding to a dispensing inlet for underfill flow;
   a substrate including:
      a first metal layer disposed at a top surface of the substrate;
      one or more lower metal layers disposed underneath the first metal layer;
      a plurality of metal contacts disposed in the first metal layer; and
      a plurality of trace segment lines; and
   a solder joint array including a plurality of solder bump rows;
   wherein each of the plurality of solder bump rows:
      is oriented substantially parallel to the inlet side of the semiconductor die; and
      electrically connects bond pads of the semiconductor die with corresponding metal contacts in the first metal layer of the substrate; and
   wherein each of the plurality of trace segment lines:
      forms a continuous data route;
      is oriented substantially parallel to the inlet side of the semiconductor die;
      and
      includes:
         a first plurality of trace segments disposed in the first metal layer and electrically coupled to each other; and
         a second plurality of trace segments disposed in the one or more lower metal layers and electrically coupled to each other and to each of the first plurality of trace segments.

2. The semiconductor device package of claim 1, wherein the first metal layer further includes a plurality of underfill channels that are substantially perpendicular to the inlet side of the semiconductor die.

3. The semiconductor device package of claim 2, wherein the plurality of underfill channels include regions corresponding to the second plurality of trace segments.

4. The semiconductor device package of claim 1, wherein, for each of the plurality of trace segment lines, each trace segment of the second plurality of trace segments has a length of at least a distance between two adjacent solder bumps.

5. The semiconductor device package of claim 1, wherein, for each of the plurality of trace segment lines, regions of the first metal layer between trace segments of the first plurality of trace segments are free from metal.

6. The semiconductor device package of claim 1, wherein, for each of the plurality of trace segment lines, regions of the first metal layer corresponding to trace segments of the second plurality of trace segments are free from metal.

7. The semiconductor device package of claim 1, wherein:
   the plurality of trace segment lines includes a first trace segment line and a second trace segment line adjacent to the first trace segment line; and
   segments of the first trace segment line that are free from metal in the first metal layer substantially overlap with segments of the second trace segment line that are free from metal in the first metal layer.

8. The semiconductor device package of claim 7, wherein the substantially overlapping segments that are free from metal form an underfill flow channel in the first metal layer.

9. The semiconductor device package of claim 1, wherein:

the semiconductor die is rectangular, including two sides having a first length and two sides having a second length shorter than the first length; and the inlet side is one of the two sides having the first length.

10. The semiconductor device package of claim 1, wherein, for each of the plurality of trace segment lines, trace segments in the first plurality of trace segments are electrically connected to trace segments in the second plurality of trace segments with vias disposed between the first metal layer and the one or more lower metal layers.

11. A semiconductor device package comprising:

a semiconductor die including:

a plurality of bond pads; and an inlet side corresponding to a dispensing inlet for underfill flow;

substrate means including:

a first metal layer disposed at a top surface of the substrate;

one or more lower metal layers disposed underneath the first metal layer;

a plurality of metal contacts disposed in the first metal layer; and a plurality of trace segment lines; and solder joint means including a plurality of solder bump rows;

wherein each of the plurality of solder bump rows:

is oriented substantially parallel to the inlet side of the semiconductor die; and electrically connects bond pads of the semiconductor die with corresponding metal contacts in the first metal layer of the substrate; and wherein each of the plurality of trace segment lines:

forms a continuous data route;

is oriented substantially parallel to the inlet side of the semiconductor die;

and includes:

a first plurality of trace segments disposed in the first metal layer and electrically coupled to each other; and a second plurality of trace segments disposed in the one or more lower metal layers and electrically coupled to each other and to each of the first plurality of trace segments.

12. The semiconductor device package of claim 11, wherein the first metal layer further includes a plurality of underfill channels that are substantially perpendicular to the inlet side of the semiconductor die.

13. The semiconductor device package of claim 12, wherein the plurality of underfill channels include regions corresponding to the second plurality of trace segments.

14. The semiconductor device package of claim 12, wherein, for each of the plurality of trace segment lines, each trace segment of the second plurality of trace segments has a length of at least a distance between two adjacent solder bumps.

* * * * *